US008941516B2

(12) United States Patent
Kim et al.

(10) Patent No.: US 8,941,516 B2
(45) Date of Patent: Jan. 27, 2015

(54) SIGNAL PROCESSING APPARATUS AND SIGNAL PROCESSING METHOD THEREOF

(71) Applicant: Korea Research Institute of Standards and Science, Daejeon (KR)

(72) Inventors: Jin Mok Kim, Daejeon (KR); Hyukchan Kwon, Daejeon (KR); Yong Ho Lee, Daejeon (KR); Ki Woong Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 230 days.

(21) Appl. No.: 13/691,180

(22) Filed: Nov. 30, 2012

(65) Prior Publication Data

US 2013/0093608 A1  Apr. 18, 2013

Related U.S. Application Data

(63) Continuation of application No. PCT/KR2010/004904, filed on Jul. 27, 2010.

(30) Foreign Application Priority Data

Jun. 3, 2010 (KR) .................. 10-2010-0052238

(51) Int. Cl.
*H03M 9/00* (2006.01)
*G06F 13/42* (2006.01)

(52) U.S. Cl.
CPC ............. *H03M 9/00* (2013.01); *G06F 13/4295* (2013.01)
USPC .......................................... 341/100; 341/101

(58) Field of Classification Search
CPC ............................ H03M 9/00; G06F 13/4295
USPC ................................. 341/100, 101, 50
See application file for complete search history.

(56) References Cited

U.S. PATENT DOCUMENTS

| 5,706,438 | A  | * | 1/1998  | Choi et al. ................. 710/71 |
| 7,253,754 | B2 | * | 8/2007  | Takeuchi et al. .......... 341/100 |
| 7,471,752 | B2 | * | 12/2008 | Ge et al. ................... 375/354 |
| 7,728,634 | B2 | * | 6/2010  | De Rijk et al. ............ 327/105 |

FOREIGN PATENT DOCUMENTS

| KR | 10-1994-0011938 B1 | 12/1994 |
| KR | 10-0228475 B1      | 8/1999  |

(Continued)

OTHER PUBLICATIONS

International Search Report for PCT/KR2010/004904 dated Jun. 10, 2011.

*Primary Examiner* — Peguy Jean Pierre
(74) *Attorney, Agent, or Firm* — Jenkins, Wilson, Taylor & Hunt, P.A.

(57) ABSTRACT

Provided are a signal processing apparatus and a signal processing method. The signal processing method include receiving a serial signal including an information frame including channel information and data information of a corresponding channel, extracting a clock signal from the serial signal, generating a load signal when a clock count reaches a maximum clock count by calculating the clock signal; converting the serial signal to a parallel signal according to the load signal, and changing the maximum clock count by comparing parallel-converted parallel channel information with a load count indicating the number of local signals.

15 Claims, 9 Drawing Sheets

(56) References Cited

FOREIGN PATENT DOCUMENTS

| | | |
|---|---|---|
| KR | 10-0261304 | 4/2000 |
| KR | 10-2004-0075243 A | 8/2004 |
| KR | 10-2007-0088205 A | 8/2007 |
| WO | WO 2011/152589 A1 | 12/2011 |

\* cited by examiner

SIGNAL PROCESSING APPARATUS AND SIGNAL PROCESSING METHOD THEREOF

CROSS-REFERENCE TO RELATED APPLICATIONS

This application is a continuation of and claims priority to PCT/KR2010/004904 filed on Jul. 27, 2010, which claims priority to Korea Patent Application No. 10-2010-0052238 filed on Jun. 3, 2010, the entireties of which are both incorporated by reference herein.

BACKGROUND OF THE INVENTION

1. Field of the Invention

The present invention relates to signal processing apparatuses and, more particularly, to apparatuses for processing serial signals into parallel signals.

2. Description of the Related Art

A voltage signal measured in a magnetically shielded room (MSR) or a radio-frequency shielded room (RFSR) by a fine sensor is transmitted to a data acquisition (DAQ) board disposed outside the shielded room. The DAQ board is hardware for converting a voltage signal output through a sensor or a signal conditioning module to a digital signal that a computer can recognize. In general, a DAQ board mounted on a computer acquires an output voltage signal and transmits the voltage signal into the computer. The voltage signal transmitted into the computer is stored in a storage device or displayed on a monitor after being analyzed and processed.

SUMMARY OF THE INVENTION

Embodiments of the present invention provide a signal processing apparatus capable of extracting channel information and data information without a mark signal.

Embodiments of the present invention also provide a signal processing method capable of extracting channel information and data information without a mark signal.

In an aspect of the present invention, a signal processing method may include receiving a serial signal including an information frame including channel information and data information of a corresponding channel; extracting a clock signal from the serial signal; generating a load signal when a clock count reaches a maximum clock count by calculating the clock signal; converting the serial signal to a parallel signal according to the load signal; and changing the maximum clock count by comparing parallel-converted parallel channel information with a load count indicating the number of local signals.

In another aspect of the present invention, a signal processing apparatus may include a clock generator receiving a serial signal including an information frame including channel information and data information of a corresponding channel to extract a clock signal from the serial signal; a clock counter receiving a clock signal of the clock generator to output a load signal when a clock count reaches a maximum clock count; a serial-to-parallel converter receiving the clock signal, the load signal, and the serial signal to convert the serial signal to a parallel signal according to the load signal; and a load signal corrector receiving the clock signal, the load signal, and parallel channel information of a predetermined location of the parallel signal and changing the maximum clock count.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Serial digital signals including an information frame are successively transmitted in series through an optical fiber without a synchronization signal. The information frame includes channel information including information on a channel and data information including corresponding data of the corresponding channel. In this case, a serial digital signal SS received at a receiver is converted to a parallel signal PS by a serial-parallel converter and a load signal LS. And then in the parallel signal, parallel channel information and a generation count of the load signal LS are compared at a location where the information on the channel is included, and a generation location of the load signal is corrected. Thus, the load signal may be generated at an accurate location to extract the channel information and the data information of the information frame from the received serial signal.

The present invention will be described more fully hereinafter with reference to the accompanying drawings, in which preferred embodiments of the invention are shown. This invention may, however, be embodied in many different forms herein. Rather, these embodiments are provided so that this disclosure will be thorough and complete, and will fully convey the scope of the invention to those skilled in the art. In the drawings, like numbers refer to like references.

Figure 1:
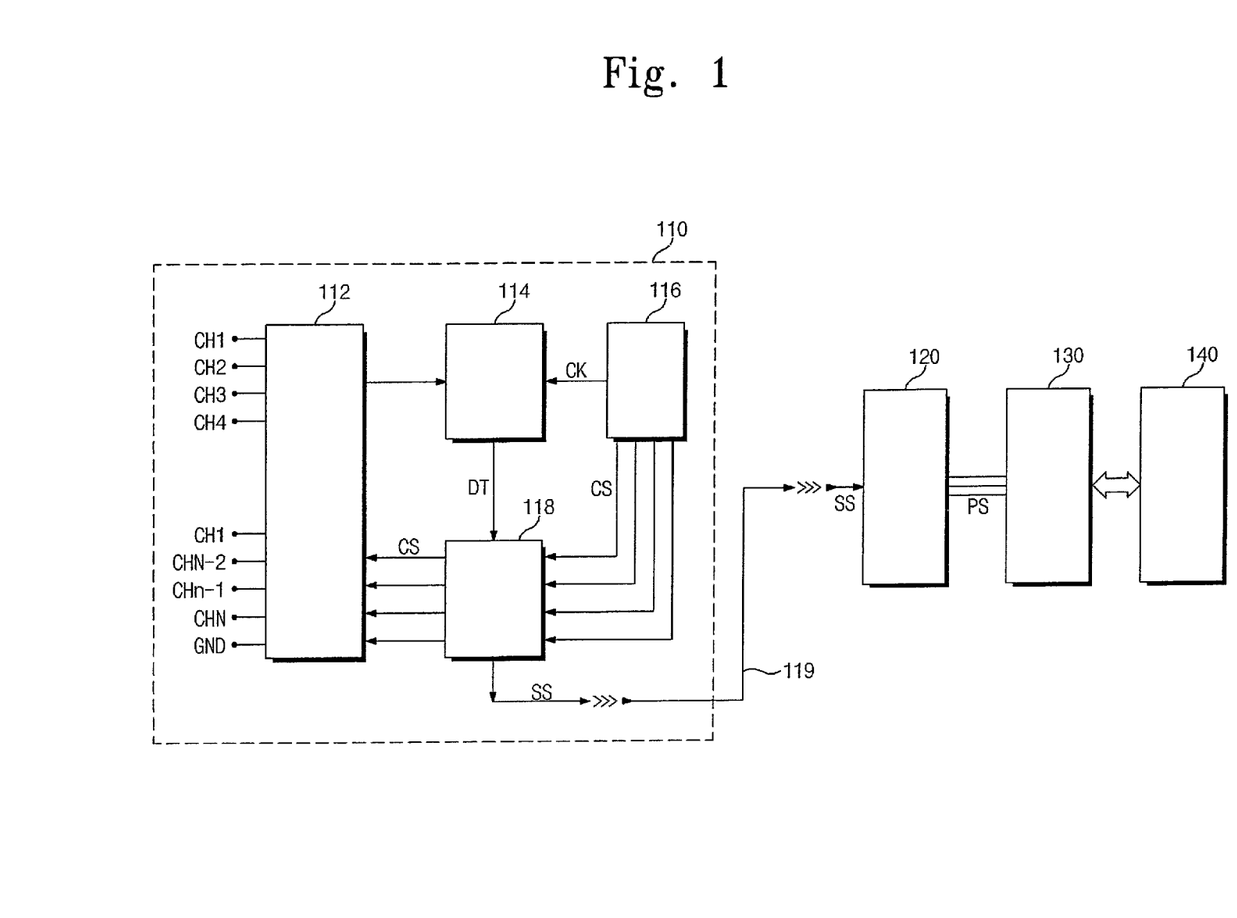
FIG. 1 illustrates a signal processing apparatus according to one embodiment of the present invention.

FIG. 1 illustrates a signal processing apparatus according to one embodiment of the present invention.

Referring to FIG. 1, a serial signal SS includes an information frame having a constant bit (n bit). The information frame includes channel information and data information. The serial signal SS includes the information frames that are successively provided. The serial signal SS may be provided to a receiver 120 after being output as an optical signal at a transmitter 110.

When the serial signal SS is transmitted through an optical cable 119, the receiver 120 receives the serial signal SS. Thereafter, the receiver 120 distinguishes the information frame from the successive serial signal SS and outputs a parallel signal PS. The parallel signal PS may be provided to a digital in/out (DIO) board 130. The DIO board 130 receives the parallel signal PS and provides the received parallel signal PS to a computer 140. The computer 140 may include application software for obtaining data. The computer 140 stores the received parallel signal PS or processes channel information CI and data information DI of the channel using software.

The transmitter 110 includes an analog switch 112, an analog-to-digital converter 114, a clock generator 116, and a parallel-to-serial converter 118.

The analog switch 112 includes input ports connected to N channels CH1~CHN. A signal input to the N channels is an analog signal, which may be a biosignal. The biosignal may include at least one of an electrocardiogram (ECG) signal, a pulse signal, an electroencephalogram (EEG) signal, an electromyography (EMG) signal, and a biomagnetic signal. The biomagnetic signal may be a magnetoenceephalogram signal or a magnetocardiogram signal. The analog signal 112 may provide a voltage value of a specific input port to the analog-to-digital converter 114 according to a channel selection signal CSS.

The clock generator 116 may include a clock unit generating a clock signal CK and a clock counter. The clock signal CK may be used as a synchronization signal in synchronization with the analog-to-digital converter 114 and/or the analog switch 112. The clock generator 116 applies a channel selection signal CSS required for the analog-to-digital converter 114 and controls the analog switch 112.

The analog-to-digital converter 114 may receive outputs of the analog switch 112 sequentially or in a determined order and output the received outputs (DT) after converting the received outputs to digital signals.

The clock generator 116 provides the channel selection signal CSS to the parallel-to-serial converter 118. The channel selection signal CSS may be a parallel signal in the form of digital. The channel selection signal CSS may be provided to the analog switch 112 directly or through the parallel-to-serial converter 118.

When the analog switch 112 operates in response to the channel selection signal CSS, a voltage of a corresponding channel is converted to a digital signal DT in the analog-to-digital converter 114. The channel selection signal CSS and the output information DT of the analog-to-digital converter 114 constitute an information frame (IF), which is output as a serial signal SS. That is, the parallel-to-serial converter 118 constitute an information frame in which channel information and voltage information of a corresponding channel are combined and the information frame is output as a serial signal.

According to a modified embodiment of the present invention, the serial signal SS is transmitted through an optical fiber after being converted to an optical signal. However, the serial signal SS is not limited to the optical signal and may be a wireless signal or a wired signal.

Conventionally, in order to obtain an accurate information frame, the transmitter 110 may transmit a load signal distinguish information frames to a receiver through an optical cable. However, in this case, the number of optical cables and circuits increase. As a method of distinguish information frames without increasing the number of optical cables, an information frame including a well-known start digital signal (mark signal) may be transmitted before a receiver receives the information frame. At this point, if the start digital signal is detected at the receiver, a load signal determining an information frame is generated. A method of transmitting a specific start digital signal includes two methods. One method is to transmit a start digital signal once when power is first turned on, and the other is to transmit a start digital signal whenever a single information frame is transmitted.

In the case of transmitting a start digital signal once when power is first turned on, a specific start digital signal is transmitted to a receiver after the power is first turned on before a transmitter transmits an information frame. Thus, an information frame reception mode is established or a load signal is generated at the receiver. The specific start digital signal has bits enough to be distinguished from a signal of an information frame, and the receiver is further provided with a circuit generating the specific start digital signal. The receiver is always powered on earlier than the transmitter and cannot obtain an accurate information frame when erroneously receiving a serial signal during its operation. If the receiver does not obtain the information frame during its operation, the receiver is reset again and a specific start digital signal is necessarily transmitted. However, when the transmitter transmits the start digital signal to the receiver via one optical cable to obtain an accurate information frame, not only the receiver but also another optical transmission circuit is required. For this reason, the number of additional circuits and power consumption increase. Moreover, a space is additionally required to mount the additional circuits and the same phenomenon occurs at the receiver.

In the case where a transmitter transmits a specific digital signal whenever a single information frame is transmitted, even when a receiver receives an erroneous serial signal, it is immediately complemented. The powers of the transmitter and the receiver may operate irrespective of their order, and it is not necessary to reset the transmitter even when an error occurs at the receiver. However, since a specific digital signal is always added to an information frame and then transmitted, the number of digital bits of an optically transmitted serial signal increases to reduce a transmission rate of an information frame signal. In addition, the transmitter must further include a circuit for generating a specific digital signal and being combined with an information frame signal, and a circuit for detecting the specific digital signal at the transmitter and separating the information frame signal is further provided. Thus, power consumption and a space required to operate the transmitter and receiver increase.

According to the present invention, a serial signal itself transmitted via an optical cable decides an information frame although a transmitter does not transmit a specific start digital signal or a load signal distinguishing information frames.

The load signal distinguishing information frames is not transmitted from the transmitter to a receiver via the optical cable, and the specific start digital signal is not transmitted from the transmitter. Thus, a serial signal transmission system of the transmitter does not require an additional circuit and space, and power consumption and a mounting space are saved. Moreover, since a specific start digital signal operating when power is applied is not required, the transmitter and the receiver may operate at any time irrespective of their order. In addition, the transmitter is not necessarily reset during its operation. On the other hand, the specific start digital signal is always added to an information frame and thus is not necessarily transmitted. That is, only an information frame signal is transmitted. For this reason, a transmission rate of the optically transmitted serial signal is not reduced. Furthermore, since the receiver does not require a circuit for always detecting the specific digital signal and separating the information frame signal, additional power consumption and space are saved.

Figure 2:
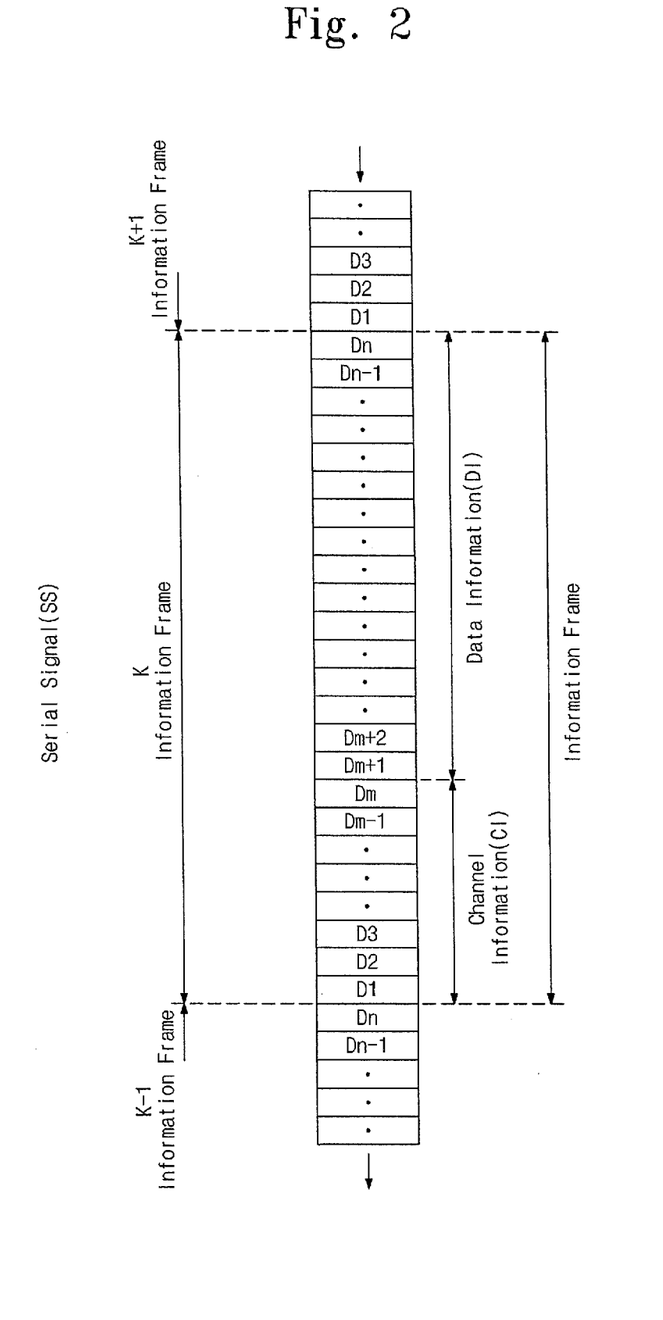
FIG. 2 illustrates a serial signal according to an embodiment of the present invention.

FIG. 2 illustrates a serial signal according to an embodiment of the present invention.

Referring to FIG. 2, the serial signal includes information frames IF that are successively disposed. Thus, the information frames IF do not include a mark signal that distinguishes them between channels.

The information frame IF includes channel information CI and data information DI. The data information DI is an output signal of a corresponding channel or an output signal of an analog-to-digital converter. After gradually increasing from a start channel (k=1) to the maximum channel (k=N), the channel information CI may be restarted at the start channel. The data information DI may be determined according to resolution of the analog-to-digital converter. In the case where a sampling frequency of the analog-to-digital converter is determined, the resolution is in inverse proportion to the number of the channels.

The serial signal SS includes successive information frames IF. However, the serial signal may not include a load signal and/or a mark signal to detect the start or end of a single information frame.

Figure 3:
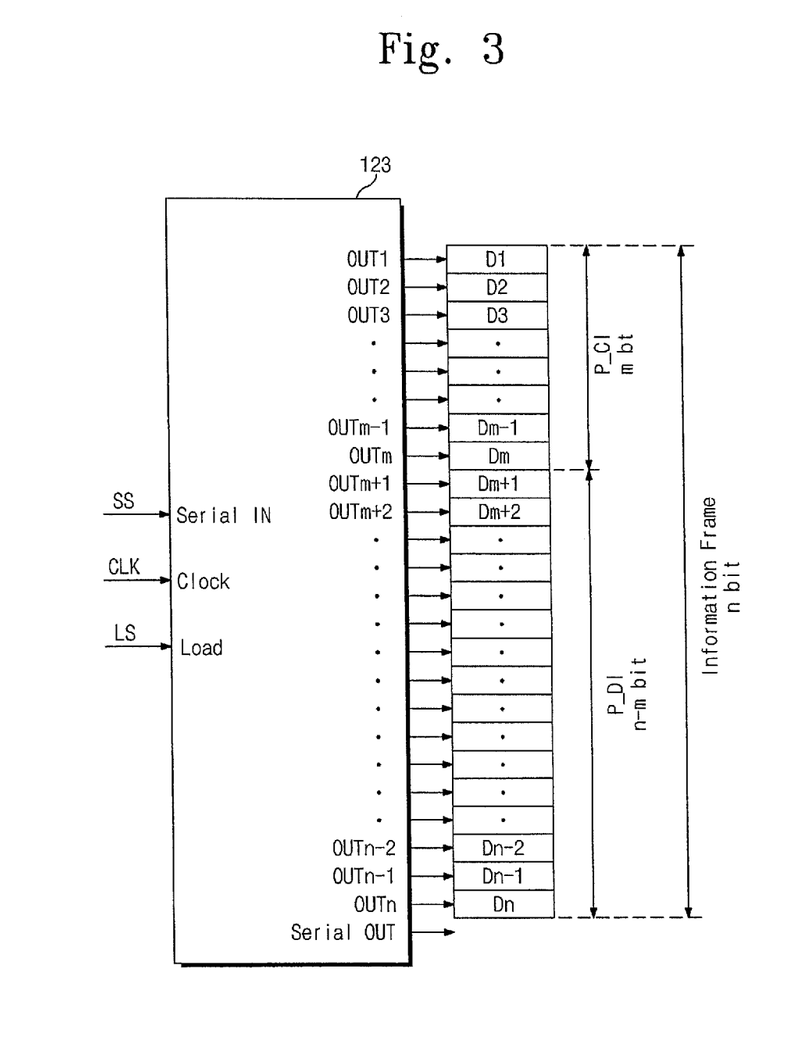
FIGS. 3 to 5 illustrate signal processing apparatuses according to other embodiments of the present invention.

FIG. 3 illustrates a signal processing apparatus according to another embodiment of the present invention.

Referring to FIG. 3, the signal processing apparatus extracts a clock signal CLK from a serial signal and generates a load signal LS to decide an information frame IF by using the clock signal CLK. The load signal LS to decide the information frame IF may be applied to a serial signal and/or a parallel signal.

A serial-to-parallel converter 123 receives a serial signal SS, the clock signal CLK, and the load signal LS to output a parallel signal. The serial-to-parallel converter 123 decides an information frame IF according to the load signal LS.

An output port of the serial-to-parallel converter 123 may include channel information ports OUT1~OUTm and data information ports OUTm+1~OUTn. When the load signal LS matches the information frame IF, channel information CI is output to the channel information ports OUT1~OUTm and the data information DI is output to the data information ports OUTm+1~OUTn.

A single information frame IF includes an n-bit signal, channel information has m channel bits, and data has (n-m) bits. In the parallel signal PS, channel information is provided from a first bit to an m-th bit and data information is provided from an (m+1)-th bit to an n-th bit. When the parallel signal PS output by operating the load signal LS matches an information frame, D1~Dm are the channel information and Dm+1~Dn are the data information.

The load signal LS may be generated when the count of the clock signal CLK corresponds to the number of digital bits constituting the information frame IF. When the load signal LS accurately decides the information frame IF, the channel information CI is output from the channel information ports OUT1~OUTm of the serial-to-parallel converter 123 and the data information DI is output from the data information ports OUTm+1~OUTm of the serial-to-parallel converter 123.

When the load signal LS does not accurately match the information frame IF, the channel information CI and the data information DI of the information frame IF are output at different locations than the channel information ports OUT1~OUTm and the data information ports OUTm+1~OUTn, respectively.

Figure 4:
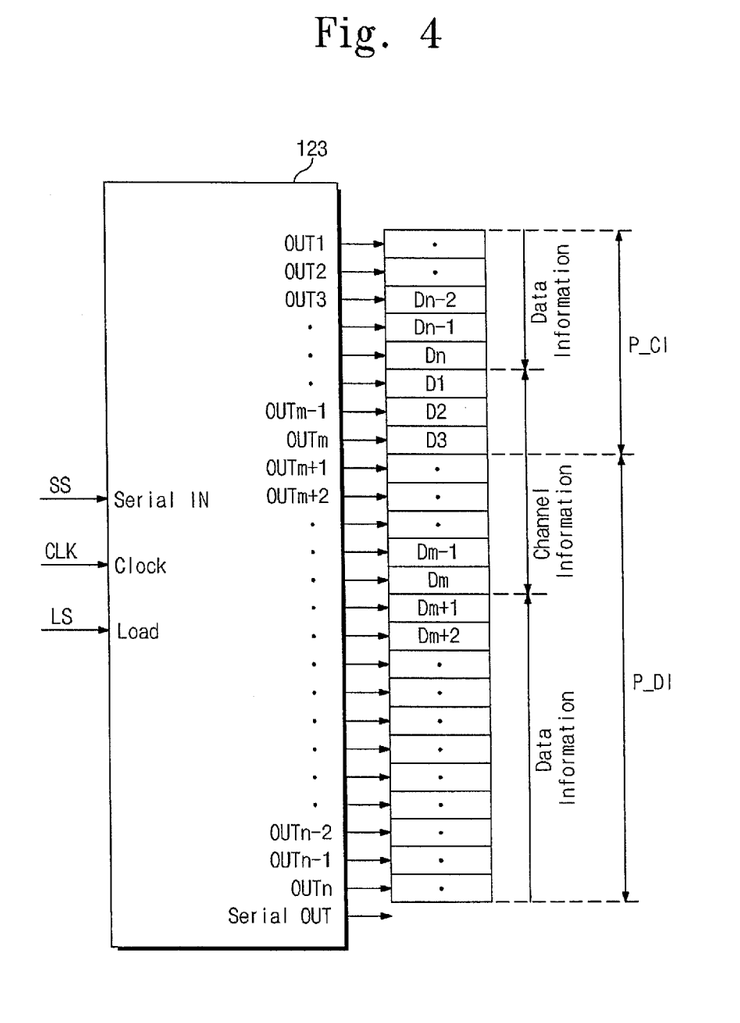

FIG. 4 illustrates a signal processing apparatus according to further another embodiment of the present invention.

Referring to FIG. 4, when a load signal does not match an information frame, parallel channel information P_CI is output from channel information ports OUT1~OUTm of a serial-to-parallel converter and parallel data information P_DI is output from data information ports OUTm+1~OUTn. However, the parallel channel information P_CI does not include channel information CI, and the parallel data information P_DI does not include data information DI. That is, the parallel channel information P_CI emerges with mixture of the channel information CI and the data information DI, and the parallel data information P_DI emerges with mixture of the channel information CI and the data information DI. Thus, in order to output an accurate information frame, the generation location of a load signal LS must be corrected such that an output signal of D1 is located at an output OUT1 of the serial-to-parallel converter.

Figure 5:
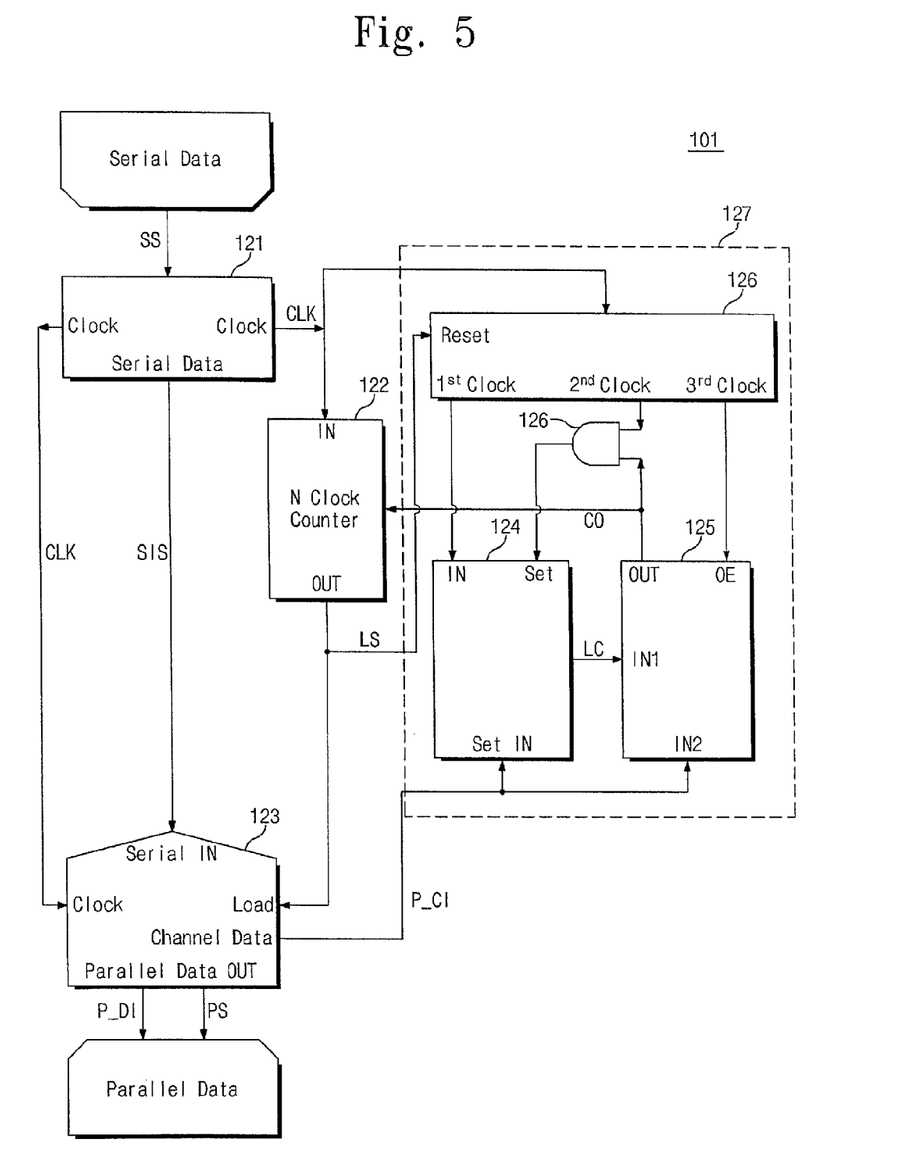

FIG. 5 illustrates a signal processing apparatus according to still another embodiment of the present invention.

Referring to FIG. 5, a signal processing apparatus 101 extracts a clock signal CLK from a serial signal SS and generates a load signal LS deciding an information frame IF by using the clock signal CLK. The load signal LS deciding the information frame IF may be applied to a serial signal and/or a parallel signal. The serial signal SS may be an optical signal. The signal processing apparatus 101 may include an optical waveguide transmitting the serial signal SS and a transmission unit providing a serial signal to the optical waveguide.

The signal processing apparatus 101 includes a clock generator 121 receiving an information frame IF including channel information CI and data information DI of a corresponding channel to extract a clock signal CLK from the serial signal SS, a clock counter 122 receiving the clock signal CLK of the clock generator 121 to output a load signal LS when the clock signal CLK reaches a maximum clock count (MCC), a serial-to-parallel converter 123 receiving the clock signal CLK, the load signal LS, and the serial signal SS to convert the serial signal SS to a parallel signal PS according to the load signal LS, and a load signal corrector 127 receiving the clock signal CLK, the load signal LS, and parallel channel information P_CI of a predetermined location of the parallel signal PS and changing the maximum clock count (MCC).

The clock generator 121 receives the serial signal SS to output a clock signal CLK and a serial information signal SIS. The serial information signal SIS is a timing-adjusted signal generated by synchronizing the serial signal SS with the clock signal CLK. The serial information signal SIS has the same information content as the serial signal SS. The serial information signal SIS and the clock signal CLK may be provided to the serial-to-parallel converter 123. The serial-to-parallel converter 123 is synchronized with the clock signal CLK to output the serial information signal SIS or the serial signal SS to the parallel signal PS according to the load signal LS.

The clock counter 121 receives the clock signal CLK and calculating the count of the clock signal CLK to output a load signal LS when the count of the clock signal CLK is equivalent to n bits and/or predetermined maximum clock count (MCC) corresponding to an information frame.

The load signal LS acts on a serial signal corresponding to length of the maximum clock count (MCC) to decide an information frame IF. The load signal LS operates the serial-to-parallel converter 123 to convert the serial signal SS to the parallel signal PS. The parallel signal PS includes parallel channel information P_CI provided from the channel information ports OUT1~OUTm of the serial-to-parallel converter 123 and parallel data information P_DI provided from data information ports OUTm+1~OUTn thereof.

The load signal LS decides an information frame at the parallel signal PS. When the load signal LS deciding an information frame at the parallel signal PS is obtained, a serial signal including a serial information frame may be decided.

Parallel channel information P_CI on the channel information CI is output from the channel information ports OUT1~OUTm of the serial-to-parallel converter 123, and parallel data information DI on data information DI is output from the data information ports OUTm+1~OUTn thereof. When the parallel channel information and the channel information do not match, an information frame is decided by correcting the generation location of the load signal LS.

The load signal corrector 127 may include a load counter 124 receiving and outputting the parallel channel information P_CI and receiving directly or indirectly the load signal LS and outputting a load count LC of a generation count of the load signal LS, a comparator 125 receiving and comparing the parallel channel information P_CI and the load count LC and outputting a compared result, and a process register unit 126 receiving the clock signal CLK of the clock generator 121 to output first to third clock signals 1 CLK, 2 CLK, and 3 CLK.

The load signal corrector 127 includes a load counter 124 counting a generation count of the load signal LS and a comparator 125 comparing the load count LC that is an output signal of the load counter 124 with the parallel channel information P_CI. A generation location of the load signal LS generated at the clock counter 122 is corrected according to an output CO of the comparator 125.

The load counter 124 may directly or indirectly receive the load signal LS and count the number of the load signals to output the load count LC to a first input terminal IN1 of the comparator 125. Alternatively, the load counter 124 receives the parallel channel information P_CI and output the received parallel channel information P_CI to the first input terminal IN1 of the comparator 125. When a set input terminal is high, the load counter 124 may receive and output the parallel channel information P_CI. Specifically, a high state of the set input terminal may be made when the output CO of the comparator 125 is high and a second clock signal 2 CLK is generated. That is, an AND circuit 126 may receive the output CO of the comparator 125 and the second clock signal 2 CLK to provide an output signal of the set input terminal SET of the load counter 124.

The comparator 125 compares a load counter signal LC or the parallel channel information P_CI provided to the first input terminal IN1 with the parallel channel information P_CI provided to a second input terminal IN2. When the two input values are equal to each other, the comparator 125 provides a HIGH signal as an output signal, when the two input values are not equal to each other, the comparator 125 provides a LOW signal as an output signal. The comparator 125 includes an OE input terminal which may operate when the load signal is generated. The OE input terminal may operate in response to a third clock signal 3 CLK of the process register unit 126.

The process register unit 126 operates the load counter 124 at the first clock 1 CLK. Thus, the load counter 124 changes the load count LC. The load counter 124 receives the parallel channel information P_CI at the second clock 2 CLK and provides the received parallel channel information P_CI to the comparator 125 as a first input IN1. The comparator 125 is activated at the third clock 3 CLK. Thus, the comparator 125 may receive the parallel channel information P_CI from the second input terminal IN2 at the third clock 3 CLK and compares the received parallel channel information P_CI with the load count LC or the parallel channel information P_CI provided by the load counter 124 to provide an output signal CO to the clock counter 122.

A parallel-to-serial converter and an analog-to-digital converter sequentially and optically transmit serial information frames of respective channels after successively and repeatedly emerging N channel analog voltage outputs form the serial information frames by combining channel information and a voltage of a corresponding channel with a serial digital signal. A receiver receives successively repeated serial signals transmitted.

According to an embodiment of the present invention, the serial signal itself decides an information frame to find each channel and voltage information of a corresponding channel. A signal processing apparatus according to the present invention may operate a transmitting and receiving system irrespective of whether a transmitter operates first or a receiver operates first. Also the signal processing apparatus may be restored immediately even when an information frame is lost due to instability of a serial signal. The signal processing apparatus itself decides an information frame without limitation of a maximum channel when transmitted channels are four or more channels due to sequential increase in channel information of the successively transmitted information frames, thereby understanding a channel and voltage information of a corresponding channel.

When the transmitter transmits the next information frame after passing one frame information, channel information has a constant rule. For example, the channel information CI may sequentially increase. Thus, in the signal processing apparatus 101, parallel channel information P_CI of the next n-bit serial signal SS increases by +1 after an n-bit serial signal is input. That is, when a channel value of one information frame is k, a channel value of the next information frame is k+1. If an information frame passes until it has a maximum channel value, it returns to an initial channel value. That is, a channel value of information frame sequentially increases at the next channel and, when the channel value reaches a maximum channel value, the next channel returns to an initial channel value. This operation is repeated. The change of channel value may allow channel information to be found in an information frame and a load signal LS may be obtained using the channel information.

Assuming that a just previous load signal LS accurately indicates an information frame IF and thus need not to be corrected, the load signal corrector 127 does not change a generation location of the load signal LS. When a clock signal CLK extracted from the serial signal SS is input to the clock counter 122 and n clock signals CLK pass, a load signal LS is generated. The load signal LS converts a serial signal SS to a parallel output PS in the serial-to-parallel converter 123 and parallel channel information P_CI of channel information ports OUT1~OUTm corresponding to channel information from the parallel output PS is extracted. The load signal LS is input to the load signal counter 124 to output the load count LC as a value obtained by adding +1 to a just previous value. The comparator 125 compares the parallel channel information P_CI with the load count signal LC. If they are identical to each other, a parallel output PS of the serial-to-parallel converter 123 is decided to be information frame. That is, when the parallel channel information P_CI and the load count LC are identical to each other, an output CO of the comparator 125 is output to be low. When two inputs of the comparator 125 are different from each other, the output CO of the comparator 125 is output to be high.

If the output CO of the comparator 125 is high, the clock counter 122 generates a load signal LS when (n+1) clock signals are generated. And then, the clock counter 122 may be restored to be n-numbered.

When the load signal LS is generated at the (n+1) clock signals, a location of each information frame at the parallel output PS of the serial-to-parallel converter 123 is shifted forward by 1 bit from a just previous location.

When the parallel channel information P_CI and the load count LC are different from each other, there may be various locations where the clock counter 122 generates the load signal LS. For example, a location of an information frame of the serial-to-parallel converter 124 is shifted backward by 1 bit from the just previous location.

When a load signal LS is generated in the number of the corrected clock signals CLK, the load counter 124 is set to read the parallel channel information P_CI of the serial-to-parallel converter 123 as SET IN and sets the read parallel channel information P_CI as a primary channel information reference value or a load count LC. Also the load counter 124 transmits the parallel channel information P_CI as a first input IN1 of the comparator 125.

Since the comparator 125 receives the load count LC and the same parallel channel information P_CI of the same value, the output CO of the comparator 125 becomes low. The clock counter 122 is corrected such that a load signal LS is generated when n clock signals CLK passes.

Hereinafter, a method of correcting a load signal deciding an information frame at a serial signal will now be described below.

Figure 6:
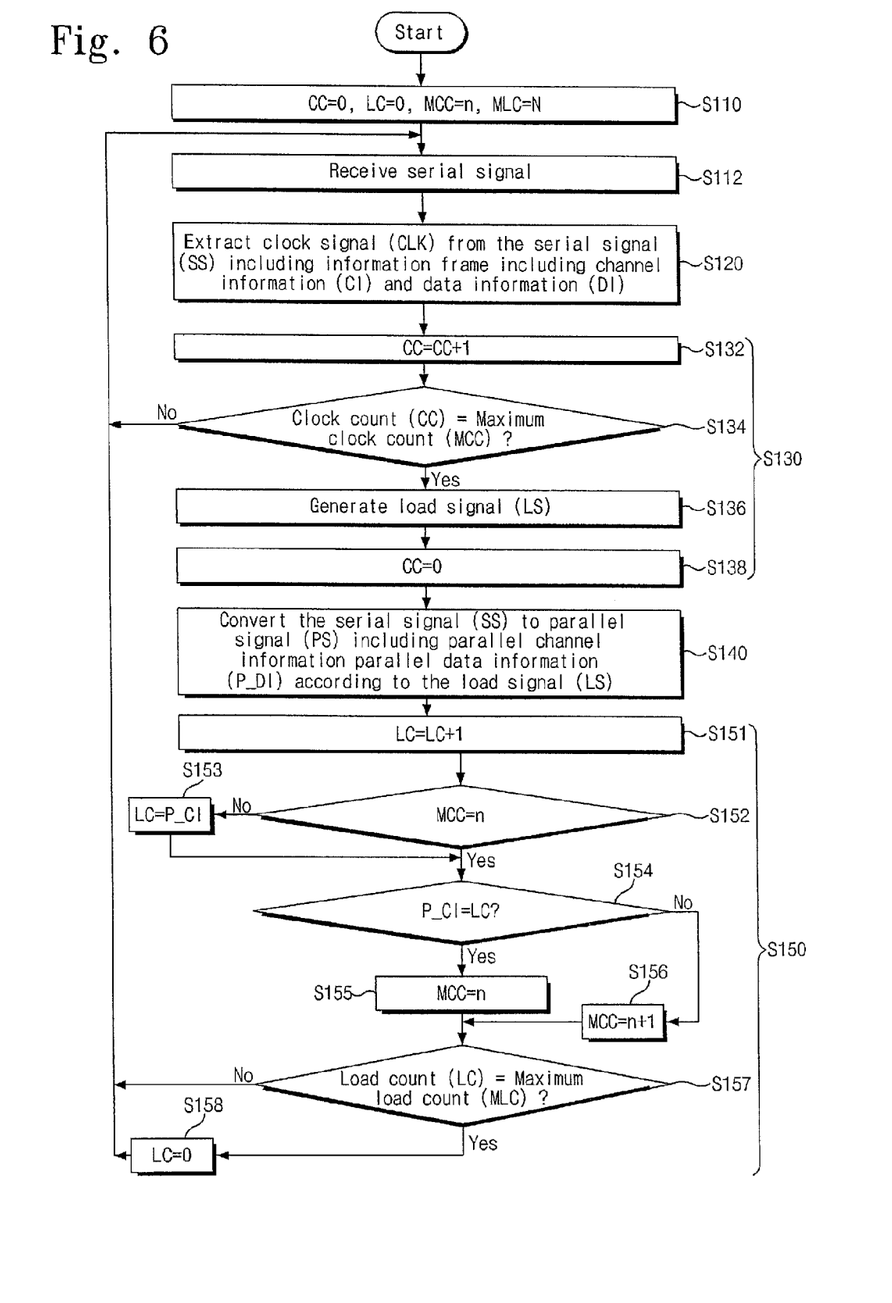
FIG. 6 is a flowchart illustrating a signal processing method according one embodiment of the present invention.

FIG. 6 is a flowchart illustrating a signal processing method according one embodiment of the present invention.

Referring to FIG. 6, the signal processing method includes receiving a serial signal SS including an information frame IF including channel information CI and data information DI of a corresponding channel (step S112), extracting a clock signal CLK from the serial signal SS (step S120), generating a load signal LS when a clock count reaches a maximum clock count MCC by calculating the clock signal CLK (step S130), converting the serial signal SS to a parallel signal PS according to the load signal LS (step S140), and changing the maximum clock count MCC by comparing parallel-converted parallel channel information P_CI with a load count LC indicating the number of local signals LS (step S150).

The serial signal SS may be transmitted through an optical cable as an optical signal. The serial signal SS may have a configuration in which information frames each including the channel information CI and data information DI of a corresponding channel are successively followed. The channel may be provided in N channels, and length of the information frame may be n bits.

A clock signal CLK may be extracted from the serial signal SS. The number of clock signals CLK may be counted by a clock counter. The maximum clock count MCC of the clock counter may be set to n. An initial clock count CC may be set to zero (step S110). A maximum load count MLC may be set to N that is the maximum number of channels.

The step S130 includes increasing a clock count CC (step S132), comparing the clock count CC with the maximum clock count MCC (step S134), generating a load signal LS when the clock count CC is the maximum clock count MCC (step S136), and resetting the clock count CC (step S138). When the clock count CC is not the maximum clock count MCC, the flow may return to the step S112. Accordingly, when the clock count CC is the maximum clock count MCC, the load signal LS is generated and the clock count CC is reset. The load signal LS may be output by a clock counter.

The step S150 includes increasing a load count LC when the load signal LS is generated (S151), comparing the maximum clock count LC with a set reference value n (S152), changing the load count LC to the parallel channel information P_CI when the maximum clock count MCC is different from the set reference value n (S153), comparing the parallel channel information P_CI with the load count LC (S154), changing the maximum clock count MCC when the parallel channel information P_CI is different from the load count LC (S156), setting the maximum clock count MCC to the set reference value n when the parallel channel information P_CI is identical to the load count LC (S155), comparing the load count LC with the set maximum load count MLC (S157), and resetting the load count LC when the load count LC is the set maximum load count MLC (S158).

When the parallel channel information P_CI is different from the load count LC, the maximum clock count MCC may be changed to n+1 or n−1. The maximum clock count MCC may be changed in other various manners.

In addition, the conversion of the load count LC is not limited to "LC=LC+1". The "LC=LC+1" corresponds to the case where channel information increases sequentially. Thus, the load count may be variously changed according to the arrangement order of the channel information.

In addition, it does not matter that the step S155 is performed at any time after generation of the load signal LS.

Figure 7:
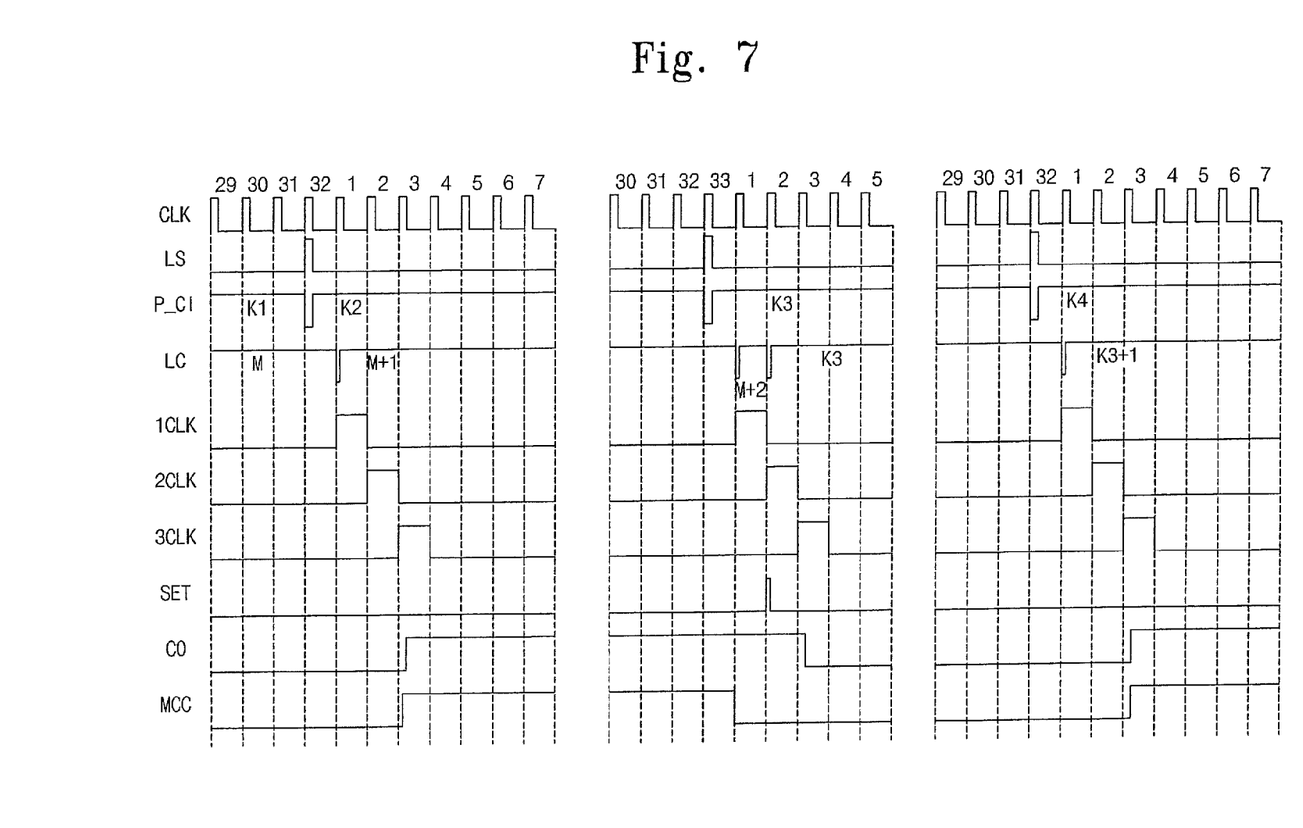
FIGS. 7 and 8 are flowcharts illustrating signal processing methods according to other embodiments of the present invention.

FIG. 7 is a flowchart illustrating signal processing methods according to another embodiment of the present invention.

Referring to FIGS. 5 to 7, an information frame has 32 bits (n=32). The clock generator receives a serial signal SS to generate a clock signal CLK.

Initially, a load count LC has M and parallel channel information P_CI has K1. Next, this corresponds to a maximum clock count (MCC=32) to generate a load signal LS. A serial-to-parallel converter 123 outputs the parallel channel information P_CI.

By a first clock 1 CLK of a process register unit, the load count LC is changed to LC+1. Since an output CO of a comparator is in a low state due to a second clock 2 CLK, SET of a load counter is maintained at a low state and thus the load counter outputs the load count LC. Accordingly, the comparator compares parallel channel information P_CI with the load count LC at a third clock 3 CLK and, because they have different values, the output CO of the comparator becomes high. The output CO of the comparator is provided to a clock counter to change the maximum clock count MCC to n+1.

Next, a second load signal LS is generated at a 33rd clock signal CLK. Accordingly, the load count LC is changed to LC+1. However, since a previous output of the comparator is high or MCC=n+1, the SET of the load counter becomes high and thus the load count LC is changed to P_CI. That is, the load count LC is set to a first channel information reference value.

And then, since the comparator receives the same input K3, the output CO of the comparator becomes low. The maximum clock count MCC is restored to an original state (MCC=n).

Next, a third load signal LS is generated at a 32nd clock signal CLK. The parallel channel information P_CI is K4, and the load count LC is K3+1. In this case, since K4 and K3+1 have different values, an output of the comparator becomes high. The maximum clock count MCC is changed to n+1.

In the next step, the load count LC is set to a second channel information reference value.

The repetition of the above steps may allow an information frame and a generation location of a load signal to match each other.

Figure 8:
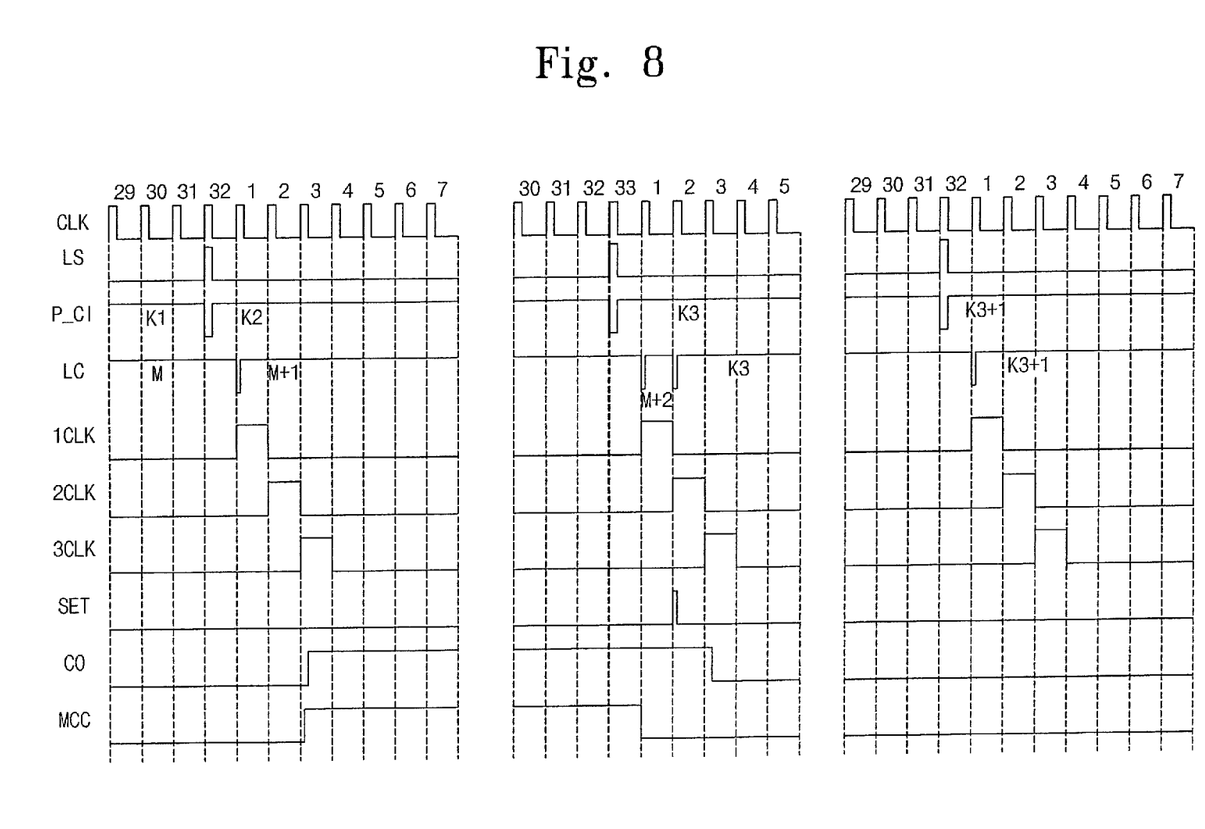

FIG. 8 is a flowchart illustrating signal processing methods according to further another embodiment of the present invention.

Referring to FIGS. 5, 6, and 8, an information frame has 32 bits (n=32). The clock generator receives a serial signal SS to generate a clock signal CLK.

Initially, a load count LC has M and parallel channel information P_CI has K1. Next, this corresponds to a maximum clock count (MCC=32) to generate a load signal LS. A serial-to-parallel converter 123 outputs the parallel channel information P_CI.

By a first clock 1 CLK of a process register unit, the load count LC is changed to LC+1. Since an output CO of a comparator is in a low state due to a second clock 2 CLK, SET of a load counter is maintained at a low state and thus the load counter outputs the load count LC. Accordingly, the comparator compares parallel channel information P_CI with the load count LC at a third clock 3 CLK and, because they have different values, the output CO of the comparator becomes high. The output CO of the comparator is provided to a clock counter to change the maximum clock count MCC to n+1.

Next, a second load signal LS is generated at a 33rd clock signal CLK. Accordingly, the load count LC is changed to LC+1. However, since a previous output of the comparator is high or MCC=n+1, the SET of the load counter becomes high and thus the load count LC is changed to P_CI. And then, since the comparator receives the same input (K3), the output CO of the comparator becomes low. The maximum clock count MCC is restored to an original state (MCC=n).

Next, a third load signal LS is generated at a 32nd clock signal CLK. The parallel channel information P_CI is K3+1, and the load count LC is K3+1. Since the load count LC and the parallel channel information P_CI have the same value, an output of the comparator becomes low. Thus, an information frame and a generation location of a load signal match each other.

Figure 9:
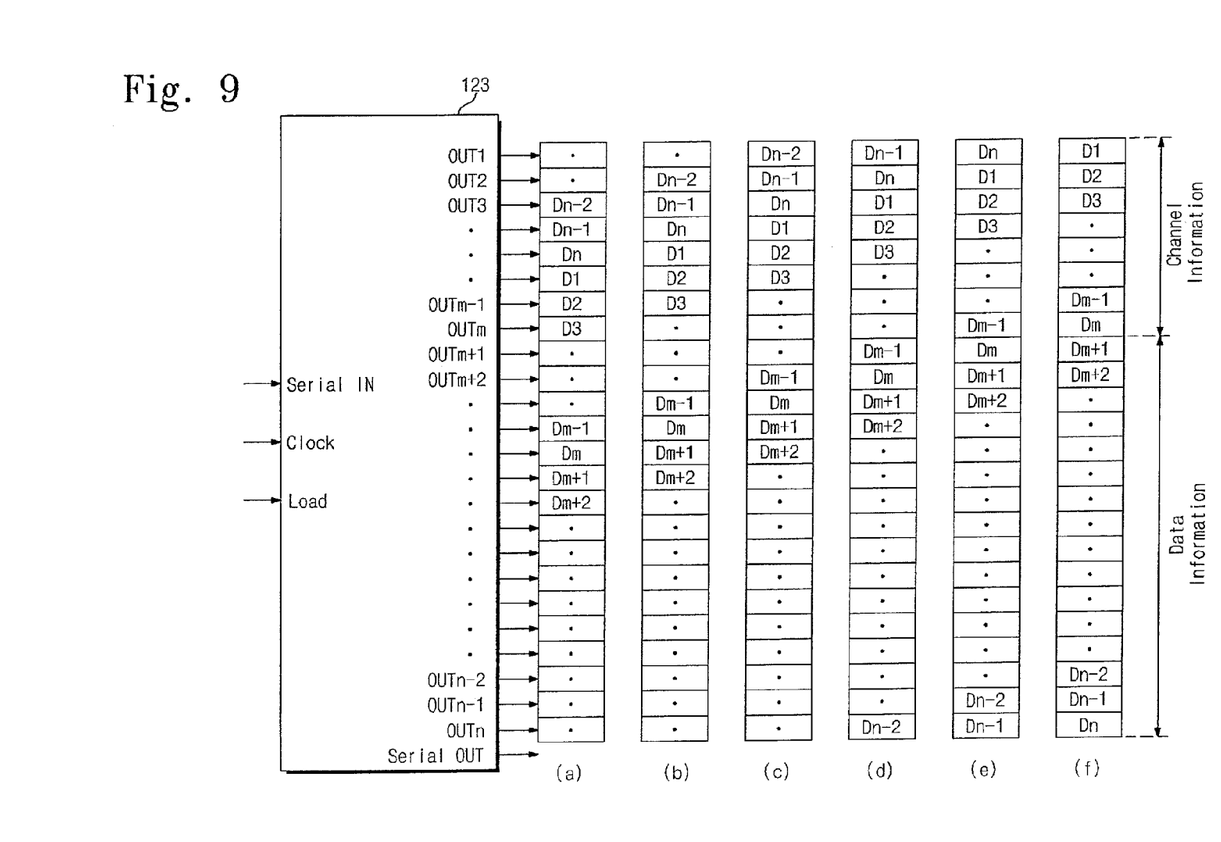
FIG. 9 illustrates a signal processing apparatus according to further another embodiment of the present invention.

FIG. 9 illustrates a signal processing apparatus according to further another embodiment of the present invention.

Referring to FIG. 9, parallel channel information P_CI of a serial-to-parallel converter 123 does not match a load count that is an output of a load counter. If a step "MCC=n+1" described in FIG. 7 are repeated five times, an information frame and a location information of a load signal may match each other.

According to embodiments of the present invention described so far, a signal processing apparatus extracts a clock signal and a load signal from a serial signal including only an information signal and automatically corrects a generation location of the load signal to decide an information frame. Thus, the signal processing apparatus can restore a signal transmission error, which occurs during transmission of a serial signal, within a short time.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A signal processing method comprising:
receiving a serial signal including an information frame including channel information and data information of a corresponding channel;
extracting a clock signal from the serial signal;
generating a load signal when a clock count reaches a maximum clock count by calculating the clock signal;
converting the serial signal to a parallel signal according to the load signal; and
changing the maximum clock count by comparing parallel-converted parallel channel information with a load count indicating the number of local signals.

2. The signal processing method as set forth in claim 1, wherein changing the maximum clock count comprises:
increasing a load count when the load signal is generated;
changing the load count to the parallel channel information when the maximum clock count is different from a set reference value;
changing the maximum clock count when the parallel channel information is different from the load count and setting the maximum clock count to the set reference value when the parallel channel information is identical to the load count; and
resetting the load count when the load count is the set maximum load count.

3. The signal processing method as set forth in claim 1, wherein generating a load signal when a clock count reaches a maximum clock count by calculating the clock signal comprises:
increasing a clock;
comparing the clock count with the maximum clock count;
generating a load signal when the clock count is the maximum clock count; and
resetting the clock count.

4. The signal processing method as set forth in claim 1, further comprising:
transmitting the parallel signal to a computer.

5. The signal processing method as set forth in claim 1, wherein the parallel signal is transmitted through an optical signal.

6. The signal processing method as set forth in claim 1, wherein the serial signal is transmitted successively and repeatedly, and the parallel signal is converted in real time.

7. A signal processing method comprising:
receiving a serial signal including an information frame including channel information and data information of a corresponding channel; and
extracting a load signal converting the serial signal to a parallel signal from the serial signal and correcting a generation location of the load signal by comparing a load count indicating the number of load signal with parallel-converted parallel channel information.

8. The signal processing method as set forth in claim 7, wherein a serial signal is converted to a parallel signal by a serial-to-parallel converter, a value of a specific location of a parallel output of the serial-to-parallel converter is set to parallel channel information, the load count is set by calculating the count of the load signal, and a generation location of the load signal is changed by comparing the parallel channel information with the load signal.

9. A signal processing apparatus comprising:
a clock generator configured to receive a serial signal including an information frame including channel information and data information of a corresponding channel to extract a clock signal from the serial signal;
a clock counter configured to receive a clock signal of the clock generator to output a load signal when a clock count reaches a maximum clock count;
a serial-to-parallel converter configured to receive the clock signal, the load signal, and the serial signal to convert the serial signal to a parallel signal according to the load signal; and
a load signal corrector configured to receive the clock signal, the load signal, and parallel channel information of a predetermined location of the parallel signal and to change the maximum clock count.

10. The signal processing apparatus as set forth in claim 9, wherein the load signal corrector comprises:
a load counter configured to receive and output the parallel channel information and receive directly or indirectly the load signal and output a load count of a generation count of the load signal;
a comparator configured to receive and compare the parallel channel information and the load count and output a compared result; and
a process register unit configured to receive the clock signal of the clock generator to output first to third clock signals.

11. The signal processing apparatus as set forth in claim 10, wherein the load counter receives and outputs parallel channel information when an output of the comparator is high and the second clock signal is generated.

12. The signal processing apparatus as set forth in claim 9, wherein the serial signal is an optical signal.

13. The signal processing apparatus as set forth in claim 9, further comprising:
- an optical waveguide configured to transmit the serial signal; and
- an optical transmitter configured to provide a serial signal to the optical waveguide.

14. A signal processing apparatus comprising:
- a clock generator configured to receive a serial signal including an information frame including channel information and data information of a corresponding channel to extract a clock signal from the serial signal;
- a clock counter configured to output a load signal by using the clock signal of the clock generator;
- a serial-to-parallel converter configured to receive the load signal and the serial signal to convert the serial signal to a parallel signal according to the load signal; and
- a load signal corrector configured to correct a generation location of the load signal by using the load signal and the parallel signal.

15. The signal processing apparatus as set forth in claim 14, further comprising:
- an optical waveguide configured to transmit the serial signal; and
- an optical transmitter configured to provide a serial signal to the optical waveguide.

* * * * *